United States Patent
Hasegawa et al.

(10) Patent No.: US 9,146,479 B2
(45) Date of Patent: Sep. 29, 2015

(54) SUBSTRATE REFERENCE IMAGE CREATION METHOD, SUBSTRATE DEFECT INSPECTION METHOD, SUBSTRATE REFERENCE IMAGE CREATION APPARATUS, SUBSTRATE DEFECT INSPECTION UNIT AND NON-TRANSITORY COMPUTER STORAGE MEDIUM

(71) Applicant: Tokyo Electron Limited, Tokyo (JP)

(72) Inventors: Izumi Hasegawa, Koshi (JP); Hiroshi Tomita, Koshi (JP); Shuji Iwanaga, Koshi (JP); Tadashi Nishiyama, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 14/083,906

(22) Filed: Nov. 19, 2013

(65) Prior Publication Data
US 2014/0160451 A1 Jun. 12, 2014

(30) Foreign Application Priority Data
Dec. 7, 2012 (JP) ................. 2012-268203

(51) Int. Cl.
G03B 27/52 (2006.01)
G03F 7/20 (2006.01)

(52) U.S. Cl.
CPC ............. *G03F 7/7065* (2013.01); *G03F 7/705* (2013.01); *G03F 7/702* (2013.01)

(58) Field of Classification Search
CPC ................. G03F 7/7065; G03F 7/705; G06T 2207/30148; G06T 7/001
USPC .................................................. 355/40, 77
See application file for complete search history.

(56) References Cited

FOREIGN PATENT DOCUMENTS

JP 2009-216515 A 9/2009

*Primary Examiner* — Peter B Kim
(74) *Attorney, Agent, or Firm* — Posz Law Group, PLC

(57) ABSTRACT

In the present invention, a planar distribution of pixel values in a picked-up substrate image is decomposed into a plurality of pixel value distribution components through use of a Zernike polynomial for each of substrate images; Zernike coefficients of the pixel value distribution components decomposed through use of the Zernike polynomial are calculated; a median value and values deviated from the median value by a predetermined value or more are extracted for every Zernike coefficients having a same couple of degrees from the calculated Zernike coefficients; substrate images having the extracted values are specified; and a substrate image being a defect inspection reference is created by combining the specified substrate images.

16 Claims, 12 Drawing Sheets

FIG.10

| WAFER NO. | PRIMARY COLOR RGB | ZERNIKE COEFFICIENT | | | | | | |
|---|---|---|---|---|---|---|---|---|
| | | Z1 | Z2 | Z3 | Z4 | Z5 | Z6 | ... |
| 1 | R | 199.072 | 1.429643 | 5.356813 | -5.21051 | 1.633402 | ... | ... |
| | G | 190.2805 | -0.90505 | 1.8984 | -0.27127 | -0.46221 | ... | ... |
| | B | 128.7317 | 0.041791 | -1.64546 | -0.88629 | -0.48501 | ... | ... |
| 2 | R | 186.684 | 0.895698 | 4.375583 | 1.362145 | -2.3215 | ... | ... |
| | G | 172.689 | -0.80906 | 1.302458 | 0.215365 | -1.03214 | ... | ... |
| | B | 158.2237 | 0.15689 | -1.56458 | 0.568563 | -0.95316 | ... | ... |
| 3 | R | 198.698 | 1.298649 | 4.865124 | -3.21355 | 2.32145 | ... | ... |
| | G | 191.4602 | -0.80906 | 1.652135 | -0.12545 | -0.23154 | ... | ... |
| | B | 135.4903 | 0.04057 | -1.72524 | -0.50322 | 0.364953 | ... | ... |
| ... | ... | ... | ... | ... | ... | ... | ... | ... |
| 6 | R | 193.8329 | 1.424099 | 4.649759 | -4.24568 | 2.08991 | ... | ... |
| | G | 186.5951 | -1.02443 | 1.087093 | -0.50281 | -0.35699 | ... | ... |
| | B | 130.6252 | 0.526801 | -0.99602 | -1.01174 | -0.58821 | ... | ... |
| ... | ... | ... | ... | ... | ... | ... | ... | ... |
| 8 | R | 189.1831 | 1.926909 | 4.054355 | -4.57569 | 1.73292 | ... | ... |
| | G | 181.9453 | -0.93451 | 1.573728 | -0.48244 | -0.8598 | ... | ... |
| | B | 125.9754 | -0.32438 | -1.4937 | -1.00603 | -0.95316 | ... | ... |

FIG.11

| ZERNIKE COEFFICIENT | PRIMARY COLOR RGB | WAFER NO. | | | | | | |
|---|---|---|---|---|---|---|---|---|
| | | 1 | 2 | 3 | ... | 6 | ... | 8 |
| Z1 | R | 199.072 | 186.684 | 198.698 | ... | 193.8329 | ... | 189.1831 |
| | G | 190.2805 | 172.689 | 191.4602 | ... | 186.5951 | ... | 181.9453 |
| | B | 128.7317 | 158.2237 | 135.4903 | ... | 130.6252 | ... | 125.9754 |
| Z2 | R | 1.429643 | 0.895698 | 1.298649 | ... | 1.424099 | ... | 1.926909 |
| | G | -0.90505 | -0.80906 | -0.80906 | ... | -1.02443 | ... | -0.93451 |
| | B | 0.041791 | 0.15689 | 0.04057 | ... | 0.526801 | ... | -0.32438 |
| Z3 | R | 5.356813 | 4.375583 | 4.865124 | ... | 4.649759 | ... | 4.054355 |
| | G | 1.8984 | 1.302458 | 1.652135 | ... | 1.087093 | ... | 1.573728 |
| | B | -1.64546 | -1.56458 | -1.72524 | ... | -0.99602 | ... | -1.4937 |
| Z4 | R | -5.21051 | 1.362145 | -3.21355 | ... | -4.24568 | ... | -4.57569 |
| | G | -0.27127 | 0.215365 | -0.12545 | ... | -0.50281 | ... | -0.48244 |
| | B | -0.88629 | 0.568563 | -0.50322 | ... | -1.01174 | ... | -1.00603 |
| Z5 | R | 1.633402 | -2.3215 | 2.32145 | ... | 2.08991 | ... | 1.73292 |
| | G | -0.46221 | -1.03214 | -0.23154 | ... | -0.35699 | ... | -0.8598 |
| | B | -0.48501 | -0.95316 | 0.364953 | ... | -0.58821 | ... | -0.95316 |
| Z6 | R | ... | ... | ... | ... | ... | ... | ... |
| | G | ... | ... | ... | ... | ... | ... | ... |
| | B | ... | ... | ... | ... | ... | ... | ... |
| ... | ... | ... | ... | ... | ... | ... | ... | ... |

SUBSTRATE REFERENCE IMAGE CREATION METHOD, SUBSTRATE DEFECT INSPECTION METHOD, SUBSTRATE REFERENCE IMAGE CREATION APPARATUS, SUBSTRATE DEFECT INSPECTION UNIT AND NON-TRANSITORY COMPUTER STORAGE MEDIUM

BACKGROUND OF THE INVENTION

1. Field of the Invention

The present invention relates to a method of creating a substrate image being a reference in defect inspection on the basis of a plurality of picked-up substrate images, a method of performing defect inspection of a substrate on the basis of the created substrate reference image, an apparatus for creating a substrate reference image, a substrate defect inspection unit, and a non-transitory computer storage medium.

This application is based upon and claims the benefit of priority of the prior Japanese Patent Application No. 2012-268203, filed in Japan on Dec. 7, 2012, the entire contents of which are incorporated herein by reference.

2. Description of the Related Art

In a photolithography process in a manufacturing process of a semiconductor device, for example, a series of treatments such as a resist coating treatment of applying a resist solution onto a wafer to form a resist film, exposure processing of exposing the resist film to a predetermined pattern, a developing treatment of developing the exposed resist film and so on are performed in sequence to form a predetermined resist pattern on the wafer. The series of treatments are performed in a coating and developing treatment system being a substrate treatment system including various treatment units that treat the wafer, transfer mechanisms that transfer the wafer and so on.

The wafer for which a series of photolithography processing has been performed in the coating and developing treatment system is subjected to a so-called macro defect inspection of performing inspection whether or not a predetermined resist film has been formed on the front surface of the wafer, or whether or not there is a scratch or adherence of foreign substance.

In such a macro defect inspection, while a mounting table on which the wafer is mounted is being moved illumination is applied to the wafer on the mounting table and, for example, an image pickup apparatus of a CCD line sensor picks up an image of the front surface of the wafer. Then, the picked-up image is subjected to image processing and the presence or absence of defects on the front surface of the wafer is determined (Japanese Laid-open Patent Publication No. 2009-216515). In the conventional defect inspection, the presence or absence of defects is determined by comparing the image of a wafer being a reference (reference wafer) and the image of a wafer to be inspected.

Incidentally, a so-called false defect that is not an actual defect but is determined as a defect because color unevenness occurs on the picked-up image of a substrate (substrate image) may occur in the defect inspection of the wafer. Therefore, the image of the wafer being the reference (reference image) is created by combining a substrate mage having color unevenness that may be determined as a false defect with the standard substrate image of a wafer having no defect. This makes it possible to take an element of the substrate image having the color unevenness into the reference image so as to prevent the color unevenness from being determined as a defect in defect inspection. In other words, the color unevenness is subjected to filtering to avoid the false defect.

A plurality of substrate images used for synthesis of the reference image are selected by an operator on the basis of the empirical rule from among images of a plurality of wafers which have been processed beforehand. In this case, the reference image to be created may differ depending on the level of skill of the operator. Therefore, a difference may occur in the result of defect inspection depending on the level of skill of the operator creating the reference image.

The present invention has been made in consideration of the above points and its object is to create an appropriate substrate reference image so as to appropriately perform defect inspection of a substrate.

SUMMARY OF THE INVENTION

The present invention is a method of picking up images of substrates and creating a substrate image being a defect inspection reference on a basis of a plurality of the picked-up substrate images, including: a component decomposition step of decomposing a planar distribution of pixel values in the picked-up substrate image into a plurality of pixel value distribution components through use of a Zernike polynomial for each of the substrate images; a Zernike coefficient calculation step of calculating Zernike coefficients of the pixel value distribution components decomposed through use of the Zernike polynomial; a Zernike coefficient extraction step of extracting, for every Zernike coefficients having a same couple of degrees, from the calculated Zernike coefficients, (1) a median value, and (2) values deviated from the median value by a predetermined value or more; an image specification step of specifying substrate images having the extracted values; and an image creation step of creating a substrate image being a defect inspection reference by combining the specified substrate images.

According to the present invention, a planar distribution of pixel values in the substrate image is decomposed into a plurality of pixel value distribution components through use of a Zernike polynomial, and Zernike coefficients of the plurality of pixel value distribution components are calculated. Then, a median value and values deviated from the median value by a predetermined value or more are extracted for every Zernike coefficients having the same couple of degrees from the calculated Zernike coefficients, and substrate images having the extracted values are specified.

In this case, the substrate image having the median value is a substrate image having an average pixel value distribution component. Further, the substrate image having the value deviated from the median value by a predetermined value or more is a substrate image which has some color unevenness and is possibly determined as having a false defect. Therefore, by combining the specified substrate images, an appropriate substrate reference image having a filtering function with respect to the color unevenness can be created. Consequently, the defect inspection of substrate can be appropriately performed. Further, it is possible to create the appropriate reference image regardless of, for example, the level of skill of the operator, and thereby stably perform the defect inspection of a substrate.

The present invention according to another aspect is a non-transitory computer readable storage medium storing a program running on a computer of a control unit that controls a substrate treatment system to cause the substrate treatment system to execute the substrate reference image creation method.

The present invention according to still another aspect is a defect inspection method of inspecting a substrate for a defect through use of a reference image created by the reference image creation method, including picking up an image of an inspection target substrate and comparing the picked-up inspection target substrate image and the reference image created in the image creation step to determine presence or absence of a defect.

The present invention according to yet another aspect is a non-transitory computer readable storage medium storing a program running on a computer of a control unit that controls a substrate treatment system to cause the substrate treatment system to execute the substrate defect inspection method.

The present invention according to further still another aspect is an apparatus for creating a substrate image being a defect inspection reference on a basis of a plurality of substrate images picked up by an image pickup apparatus, including: a component decomposition part configured to decompose a planar distribution of pixel values in the picked-up substrate image into a plurality of pixel value distribution components through use of a Zernike polynomial for each of the substrate images; a Zernike coefficient calculation part configured to calculate Zernike coefficients of the pixel value distribution components decomposed through use of the Zernike polynomial; a Zernike coefficient extraction part configured to extract, for every Zernike coefficients having a same couple of degrees, from the calculated Zernike coefficients, (1) a median value, and (2) values deviated from the median value by a predetermined value or more; an image specification part configured to specify substrate images having the extracted values; and an image creation part configured to create a substrate image being a defect inspection reference by combining the specified substrate images.

The present invention according to further another aspect is a defect inspection unit including the substrate reference image creation apparatus, including: an image pickup apparatus configured to pick up an image of an inspection target substrate; and a defect determination part configured to compare the inspection target substrate image picked up by the image pickup apparatus and the reference image created in the image creation part to determine presence or absence of a defect.

According to the present invention, it is possible to create an appropriate substrate reference image so as to appropriately perform defect inspection of a substrate.

BRIEF DESCRIPTION OF THE DRAWINGS

FIG. 10 is a chart listing values of the Zernike coefficients found for a plurality of wafers;

FIG. 11 is a chart expressing a state that the values of Zernike coefficients are grouped for every Zernike coefficients of the same term number and for each primary color;

DETAILED DESCRIPTION OF THE INVENTION

Figure 1:
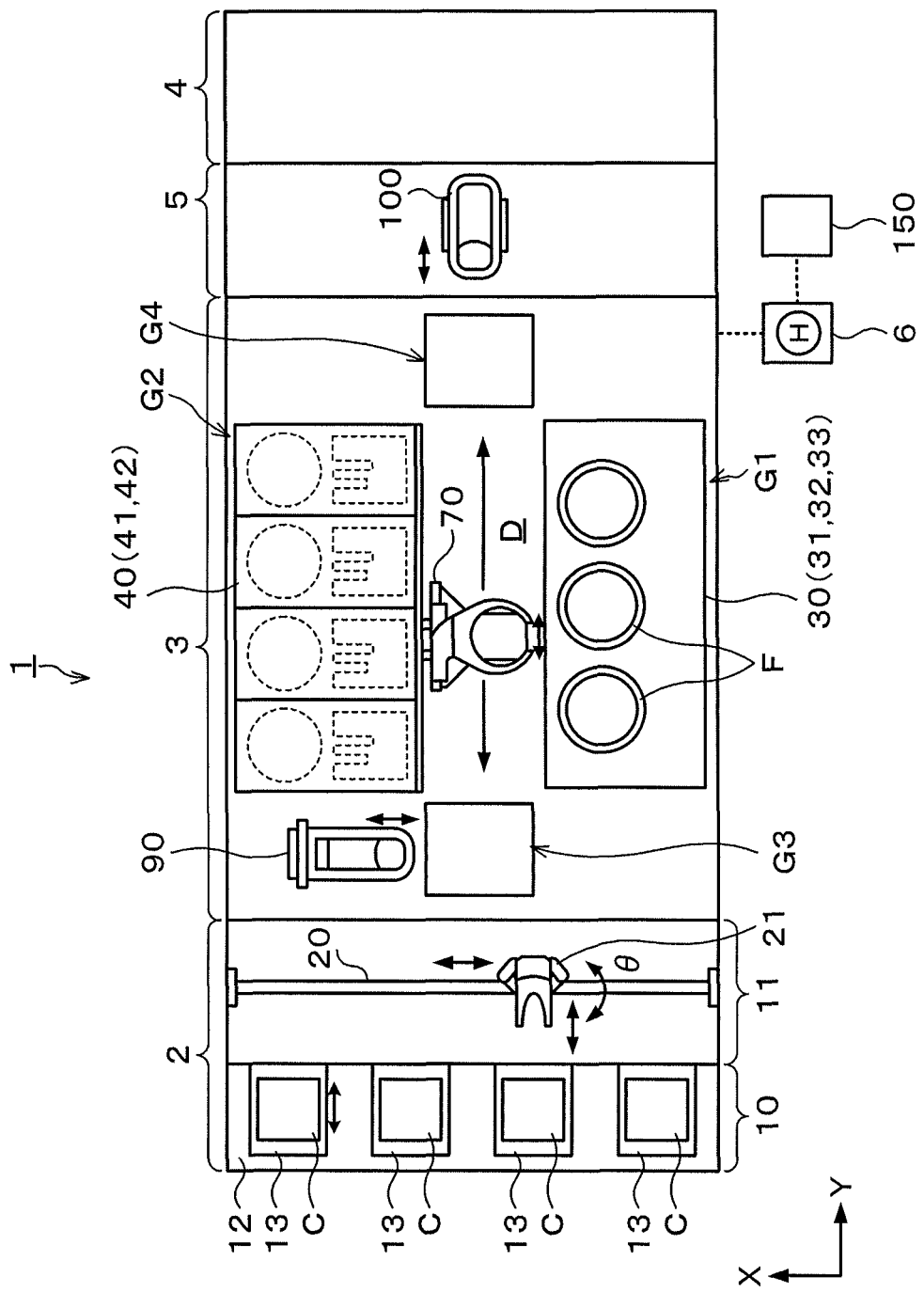
FIG. 1 is a plan view illustrating the outline of an internal configuration of a substrate treatment system according this embodiment.
Figure 2:
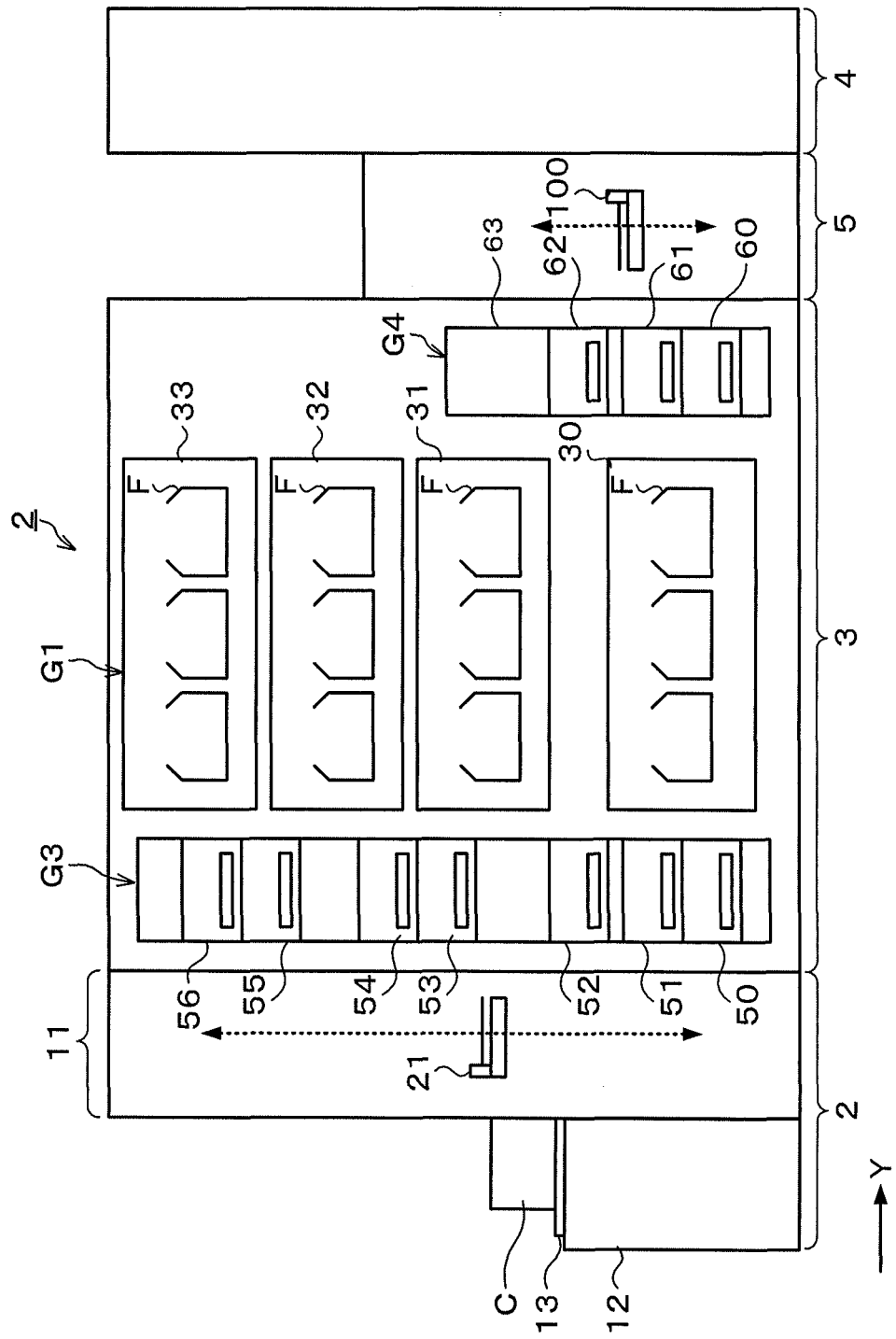
FIG. 2 is a side view illustrating the outline of the internal configuration of the substrate treatment system according this embodiment.
Figure 3:
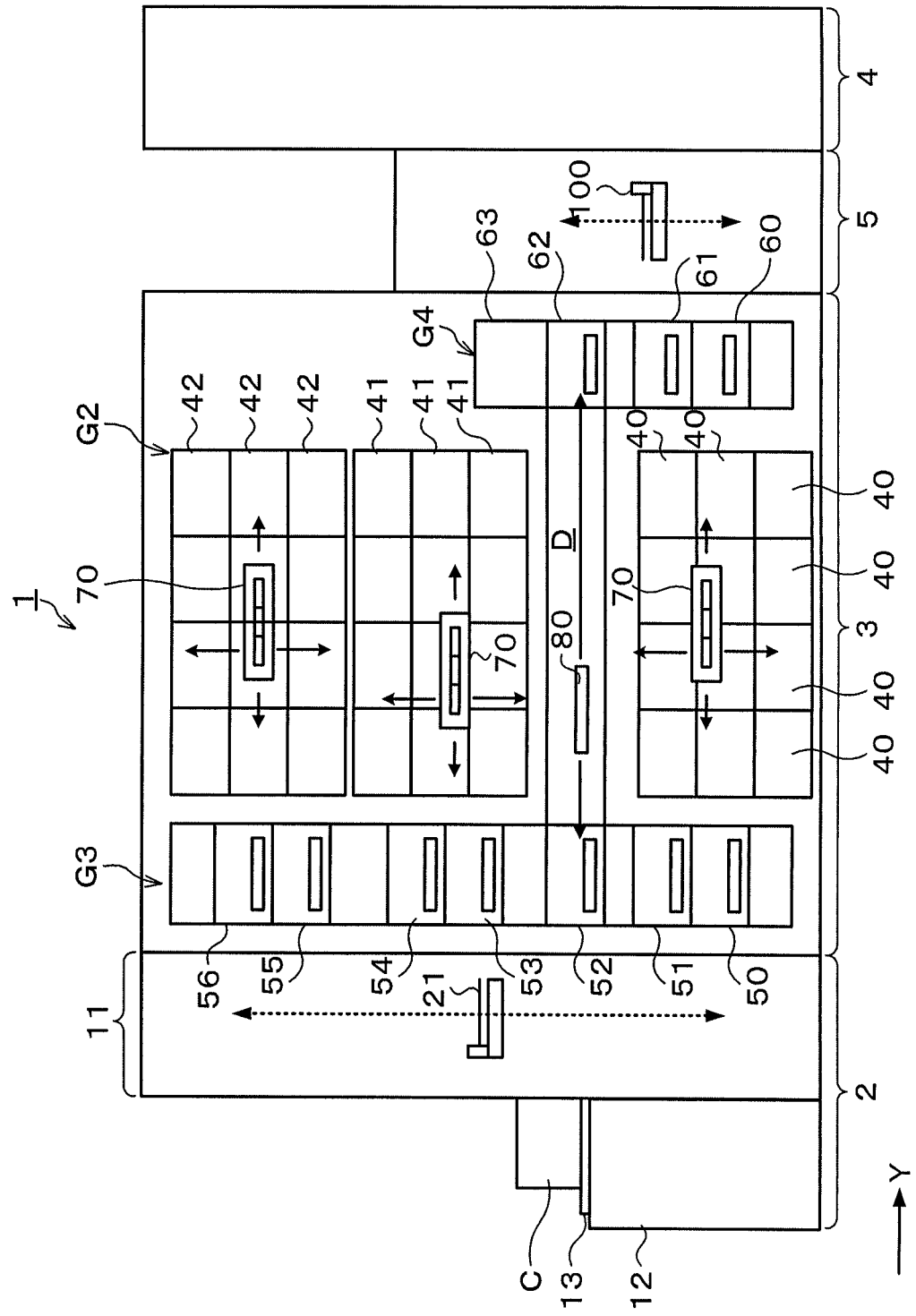
FIG. 3 is a side view illustrating the outline of the internal configuration of the substrate treatment system according this embodiment.

Hereinafter, an embodiment of the present invention will be described. FIG. 1 is an explanatory view illustrating the outline of an internal configuration of a substrate treatment system 1 including a reference image creation apparatus according to this embodiment. FIG. 2 and FIG. 3 are side views illustrating the outline of the internal configuration of the substrate treatment system 1. Note that a case where the substrate treatment system 1 is a coating and developing treatment system that performs, for example, photolithography processing on a substrate will be described as an example in this embodiment.

The substrate treatment system 1 has, as illustrated in FIG. 1, a configuration in which, for example, a cassette station 2 as a transfer-in/out section into which a cassette C is transferred in/out from/to, for example, the outside, a treatment station 3 as a treatment section which includes a plurality of various kinds of treatment units that perform predetermined treatments in a manner of single wafer treatment in the photolithography processing, and an interface station 5 as a transfer section that delivers the wafer W to/from an exposure apparatus 4 adjacent to the treatment station 3, are integrally connected. The substrate treatment system 1 also has a control unit 6 that performs control of the substrate treatment system 1. To the control unit 6, a later-described reference image creation apparatus 150 is connected.

The cassette station 2 is divided, for example, into a cassette transfer-in/out section 10 and a wafer transfer section 11. For example, the cassette transfer-in/out section 10 is provided on the end portion on a Y-direction negative direction (a left direction in FIG. 1) side of the substrate treatment system 1. In the cassette transfer-in/out section 10, a cassette mounting table 12 is provided. On the cassette mounting table 12, a plurality of for example, four mounting plates 13 are provided. The mounting plates 13 are provided, arranged side by side in a line in an X-direction (a top and bottom direction in FIG. 1) being the horizontal direction. On the mounting plates 13, cassettes C can be mounted when the cassettes C are transferred in/out from/to the outside of the substrate treatment system 1.

In the wafer transfer section 11, a wafer transfer apparatus 21 is provided which is movable on a transfer path 20 extending in the X-direction as illustrated in FIG. 1. The wafer transfer apparatus 21 is movable also in the vertical direction and around a vertical axis (in a θ-direction), and can transfer the wafer W between the cassette C on each of the mounting plates 13 and a later-described delivery unit in a third block G3 in the treatment station 3.

In the treatment station 3, a plurality of, for example, four blocks G1, G2, G3, G4 are provided each including various units. For example, the first block G1 is provided on the front side (an X-direction negative direction side in FIG. 1) in the treatment station 3, and the second block G2 is provided on the rear side (an X-direction positive direction side in FIG. 1) in the treatment station 3. Further, the third block G3 is provided on the cassette station 2 side (the Y-direction negative direction side in FIG. 1) in the treatment station 3, and the fourth block G4 is provided on the interface station 5 side (a Y-direction positive direction side in FIG. 1) in the treatment station 3.

In the first block G1, as illustrated in FIG. 2, a plurality of solution treatment units, for example, a developing treatment unit 30 that performs developing treatment on the wafer W, a lower anti-reflection film forming unit 31 that forms an anti-reflection film under a resist film of the wafer W (hereinafter, referred to as a "lower anti-reflection film"), a resist coating unit 32 that applies a resist solution to the wafer W to form a resist film, and an upper anti-reflection film forming unit 33 that forms an anti-reflection film over the resist film of the wafer W (hereinafter, referred to as an "upper anti-reflection film"), are four-tiered in order from the bottom.

Each of the units 30 to 33 in the first block G1 has a plurality of cups F, each of which houses the wafer W therein at treatment, in the horizontal direction and can treat a plurality of wafers W in parallel.

In the second block G2, as illustrated in FIG. 3, thermal treatment units 40 each of which performs heat treatment and cooling treatment on the wafer W, adhesion units 41 as hydrophobic treatment apparatuses each of which performs hydrophobic treatment on the wafer W, and edge exposure units 42 each of which exposes the outer peripheral portion of the wafer W are arranged one on top of the other in the vertical direction and side by side in the horizontal direction. Note that the numbers and the arrangement of the thermal treatment units 40, adhesion units 41, and edge exposure units 42 can be arbitrarily selected.

In the third block G3, a plurality of delivery units 50, 51, 52, 53, 54, 55, 56 are provided in order from the bottom. Further, in the fourth block. G4, a plurality of delivery units 60, 61, 62, and a defect inspection unit 63 are provided in order from the bottom.

A wafer transfer region D is formed in a region surrounded by the first block G1 to the fourth block G4 as illustrated in FIG. 1. In the wafer transfer region D, for example, a wafer transfer apparatus 70 is disposed.

The wafer transfer apparatus 70 has a transfer arm that is movable, for example, in the Y-direction, the forward and backward direction, the θ-direction, and the up and down direction. The wafer transfer apparatus 70 can move in the wafer transfer region f) to transfer the wafer W to a predetermined unit in the first block G1, the second block G2, the third block G3 and the fourth block G4 therearound. A plurality of the wafer transfer apparatuses 70 are arranged, for example, one above the other as illustrated in FIG. 3 and can transfer the wafers W, for example, to predetermined units in the blocks G1 to G4 at about the same levels as them.

Further, in the wafer transfer region ID, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W and transfer the wafer W between the delivery unit 52 in the third block G3 and the delivery unit 62 in the fourth block G4.

As illustrated in FIG. 1, a wafer transfer apparatus 90 is provided on the X-direction positive direction side of the third block G3. The wafer transfer apparatus 90 has a transfer arm that is movable, for example, in the forward and backward direction, the θ-direction, and the up and down direction. The wafer transfer apparatus 90 can move up and down while supporting the wafer W to transfer the wafer W to each of the delivery units in the third block G3.

In the interface station 5, a wafer transfer apparatus 100 is provided. The wafer transfer apparatus 100 has a transfer arm that is movable, for example, in the forward and backward direction, the θ-direction, and the up and down direction. The wafer transfer apparatus 100 can transfer the wafer W to each of the delivery units in the fourth block G4 and the exposure apparatus 4 while supporting the wafer W by the transfer arm.

Next, the configuration of the defect inspection unit 63 will be described.

Figure 4:
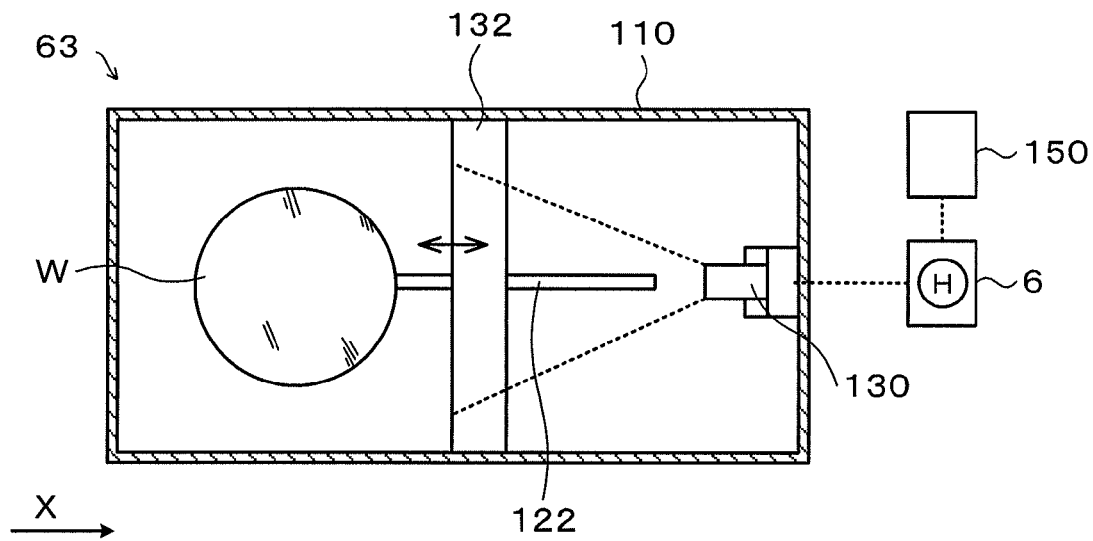
FIG. 4 is a transverse sectional view illustrating the outline of a configuration of a defect inspection unit.
Figure 5:
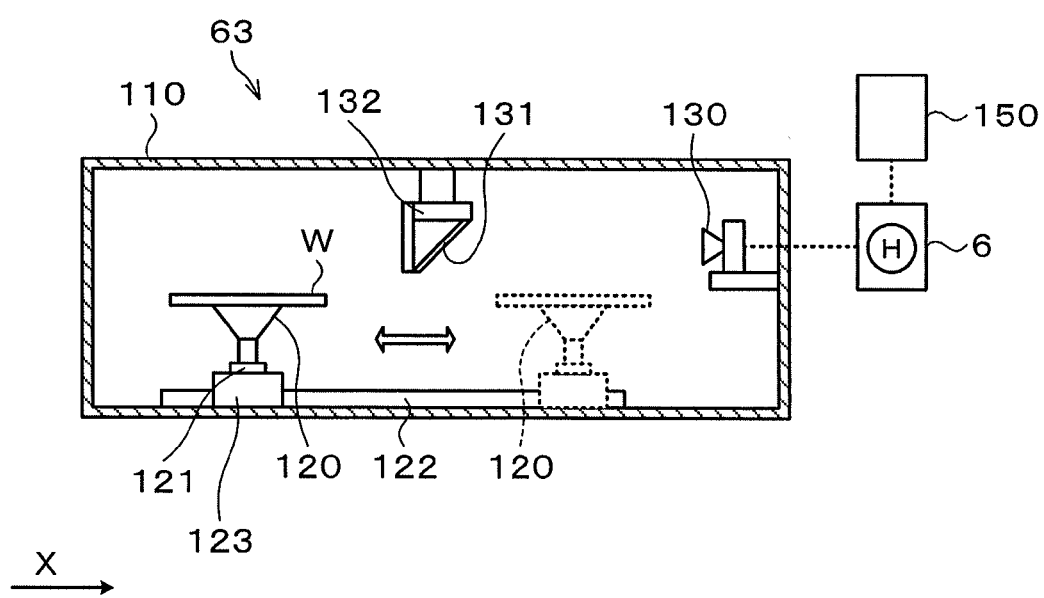
FIG. 5 is a longitudinal sectional view illustrating the outline of the configuration of the defect inspection unit.

The defect inspection unit 63 has a casing 110 as illustrated in FIG. 4. In the easing 110, a mounting table 120 on which the wafer W is mounted is provided as illustrated in FIG. 5. The mounting table 120 freely rotates and stops by means of a rotation drive part 121 such as a motor. On the bottom surface of the casing 110, a guide rail 122 is provided which extends from one end side (an X-direction negative direction side in FIG. 5) to the other end side (an X-direction positive direction side in FIG. 5) in the casing 110. The mounting table 120 and the rotation drive part 121 are provided on the guide rail 122 and movable along the guide rail 122 by means of a drive device 123.

An image pickup apparatus 130 is provided on a side surface on the other end side (the X-direction positive direction side in FIG. 5) inside the casing 110. For example, a wide-angle CCD camera is used as the image pickup apparatus 130, and the number of bits of the image is 8 (256 gradations from 0 to 255). Near the upper middle of the casing 110, a half mirror 131 is provided. The half mirror 131 is provided at a position facing the image pickup apparatus 130 and in a state to be inclined upward at 45 degrees toward the image pickup apparatus 130 from a state that its mirror surface is directed vertically downward. Above the half mirror 131, an illumination device 132 is provided. The half mirror 131 and the illumination device 132 are fixed to the upper surface of the inside of the casing 110. The illumination from the illumination device 132 passes through the half mirror 131 and is applied downward. Accordingly, light reflected off an object existing below the illumination device 132 is further reflected off the half mirror 131 and captured into the image pickup apparatus 130. In other words, the image pickup apparatus 130 can pick up an image of the object existing within an irradiation region by the illumination device 132. Then, the picked-up image of the wafer W (substrate image) is inputted into the control unit 6 and into the reference image creation apparatus 150 via the control unit 6.

The control unit 6 is composed of a computer including, for example, a CPU, a memory and so on and has a program storage part (not illustrated). In the program storage part, a program is stored that controls defect inspection of the wafer W performed on the basis of the substrate image picked up in the defect inspection unit 63, and the control unit 6 functions also as a defect determination part that determines the presence or absence of a defect of the wafer W. In addition, programs for implementing predetermined operations in the substrate treatment system 1, namely, application of a resist solution to the wafer W, development, heat treatment, delivery of the wafer W, control of the units by controlling the actions of the above-described various treatment units and the drive system such as the transfer apparatuses are also stored in the program storage part. Note that the programs may be those stored, for example, in a computer-readable storage medium H such as a hard disk (HD), compact disk (CD), magneto-optical disk (MO) or memory card and installed from the storage medium H into the control unit 6.

The program for controlling the defect inspection stored in the program storage part of the control unit 6 is a program for determining, for example, the presence or absence of defects possibly occurring on the wafer W, such as wind ripple, comet, scratch, center mode, hot spot. Concretely, the reference image created in the later-described reference image creation apparatus 150 is stored so that the substrate image picked up in the defect inspection unit 63 is compared with the reference image. Then, when pixel values on the substrate image are different from pixel values on the reference image by a predetermined value or more, it is determined that there is some defect on the wafer W, and a concrete defect determination is performed. For the defect determination, defect models created by combining images of templates simulating the defects of the wafer W and an image of a wafer W without defect are used, and the substrate image determined as having a defect is compared with the defect models. Then, when the substrate image resembles any one of the defect models, it is determined that there is a defect, whereas when the substrate image does not resemble any one of the defect models, it is determined that there is no defect. Note that in this case, a defect that is determined as being present in the comparison with the reference image but determined as being absent in the comparison with the defect models is a so-called false defect.

Figure 6:
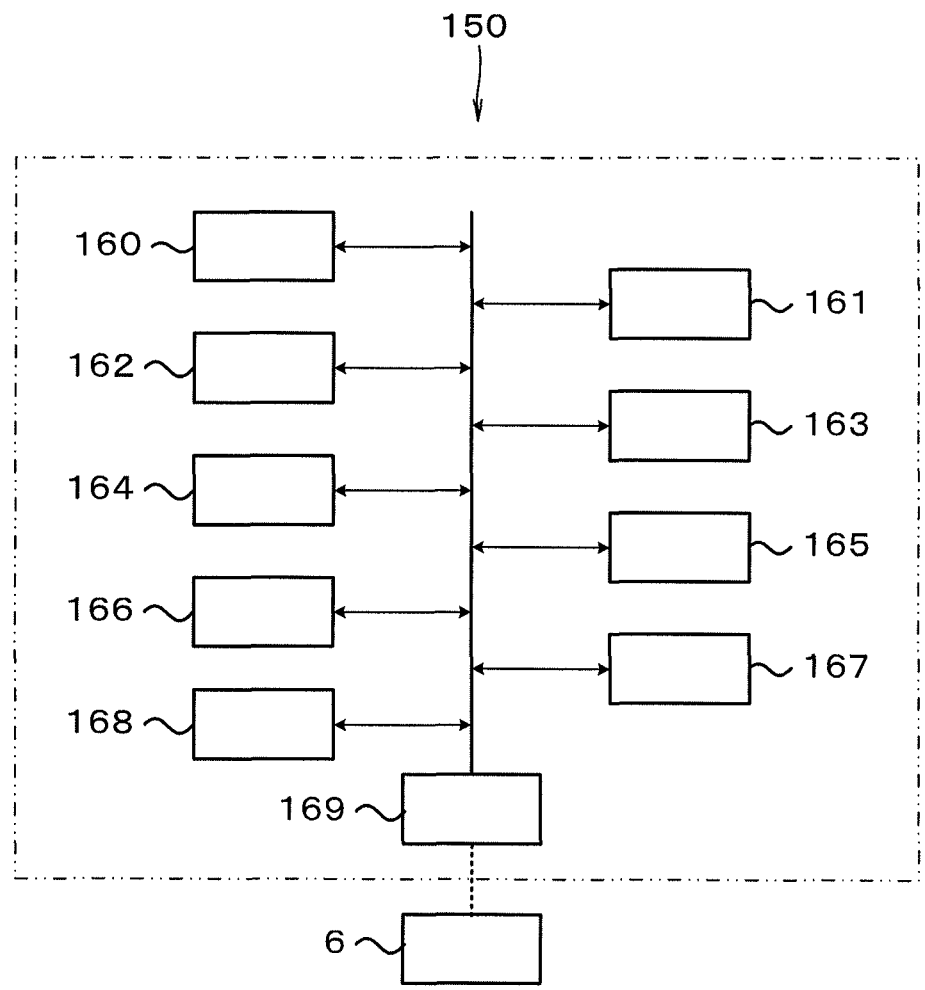
FIG. 6 is an explanatory view illustrating the outline of a configuration of a reference image creation apparatus.

Next, the configuration of the reference image creation apparatus 150 that performs processing on the substrate image picked up in the defect inspection unit 63 will be described. The reference image creation apparatus 150 is composed of a general-purpose computer including, for example, a CPU, a memory and so on. The reference image creation apparatus 150 has, for example, as illustrated in FIG. 6: a component decomposition part 160 that decomposes the planar distribution of pixel values in the substrate image picked up by the image pickup apparatus 130 in the defect inspection unit 63 into a plurality of pixel value distribution components through the use of the Zernike polynomial; a Zernike coefficient calculation part 161 that calculates Zernike coefficients of the decomposed pixel value distribution components; a Zernike coefficient group creation part 162 that groups the calculated Zernike coefficients for every Zernike coefficients having the same couple of degrees; a standard deviation calculation part 163 that finds standard deviations of the calculated Zernike coefficients; a primary color specification part 164 that specifies a primary color having the highest standard deviation for each couple of degrees of the Zernike coefficients; a Zernike coefficient extraction part 165 that extracts predetermined values from the Zernike coefficients; an image specification part 166 that specifies the substrate images having the values extracted by the Zernike coefficient extraction part 165, and an image creation part 167 that creates a substrate image being a defect inspection reference by combining the specified substrate images. The reference image creation apparatus 150 is further provided with a communication part 168 that inputs/outputs various kinds of information such as the substrate image from/to the control unit 6, and an output and display part 169 that outputs and displays the substrate image and the like.

Note that the substrate image is generally composed of three primary colors of RGB (Red, Green, Blue). Therefore, a pixel value distribution component Zi can be obtained for each of the primary colors R, G, B, and there is no difference in the method of image processing among R, G, B. Accordingly, this embodiment will be described assuming that the processing is performed for all of the primary colors R, G, B in parallel when not particularly specifying R, G, B.

Figure 7:
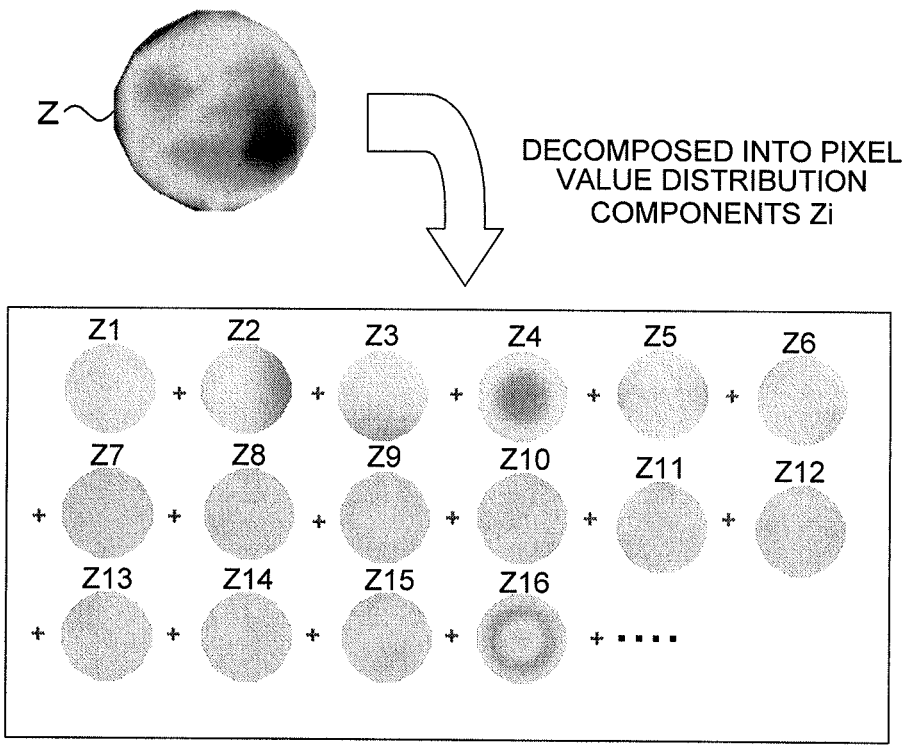
FIG. 7 is an explanatory view illustrating a state that a planar distribution of pixel values into a plurality of pixel value distribution components through the use of the Zernike polynomial.

The component decomposition part 160 first digitizes the color of the substrate image inputted into the reference image creation apparatus 150 from the control unit 6, as pixel values, for example, by a pixel unit over the entire surface of the wafer W. Thus, the planar distribution of the pixel values within the wafer is found. The component decomposition part 160 then decomposes the planar distribution of the pixel values within the wafer into a plurality of pixel value distribution components Zi (i is an integer of 1 or higher). The plurality of pixel value distribution components Zi are expressed by decomposing a planar distribution Z of the pixel values within the wafer into a plurality of components through the use of the Zernike polynomial as illustrated in FIG. 7.

The Zernike polynomial will be explained here. The Zernike polynomial is a function of a complex variable mainly used in the optical field and has a couple of degrees (n, m). The Zernike polynomial is also a function on a unit circle with a radius of 1 and has polar coordinate arguments (r, θ). The Zernike polynomial is used, for example, for analyzing the aberration component of a lens in the optical field, so that the aberration component based on each independent wavefront, for example, the shape of a mount, a saddle or the like can be recognized by decomposing wavefront aberration through the use of the Zernike polynomial.

Figure 8:
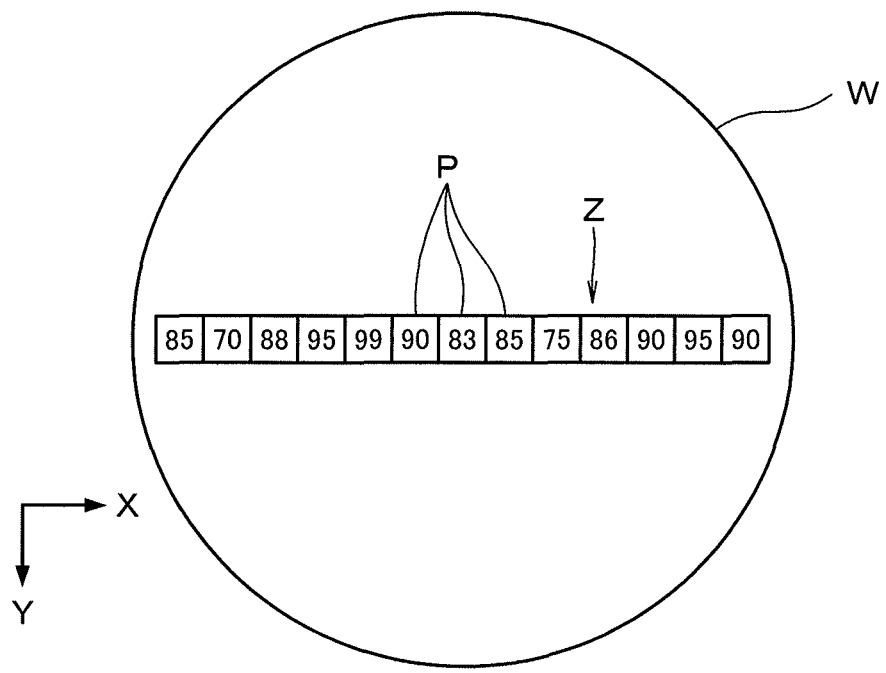
FIG. 8 is an explanatory view expressing pixel values of pixels within the wafer.
Figure 9:
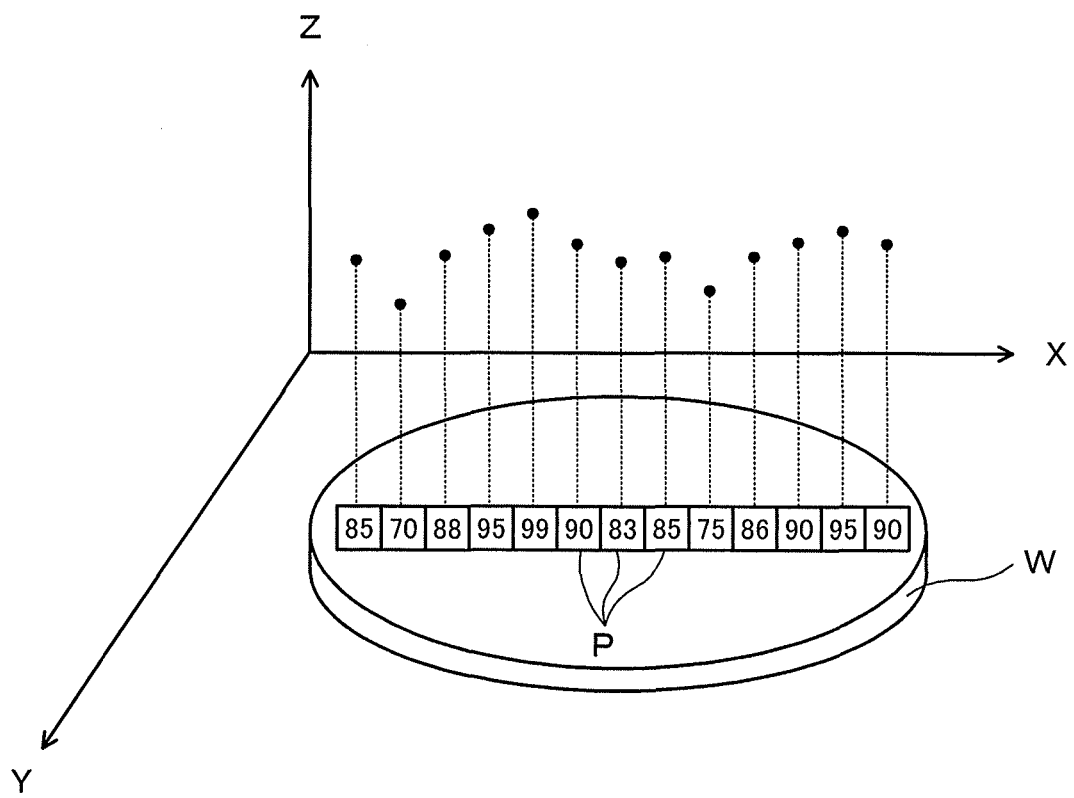
FIG. 9 is an explanatory view expressing the pixel values within the wafer in the height direction on the wafer.

Next, the way to find the pixel value distribution component Zi through the use of the Zernike polynomial in this embodiment will be described using FIG. 8 and FIG. 9. FIG. 8 expresses the planar distribution Z of the pixel values of pixels P within the wafer W, in which the numerical value indicated inside each pixel P represents the pixel value of the pixel P. For easy explanation, only pixels P in one line along an X-axis direction are illustrated in FIG. 8 and FIG. 9. When applying the Zernike polynomial to the planar distribution Z of the pixel values illustrated in FIG. 8, the pixel values of the pixels P are expressed, for example, in the height direction on the wafer W (in a Z-direction positive direction in FIG. 9) as illustrated in FIG. 9. As a result, the planar distribution of the pixel values of the pixels P can be grasped as a curve in a predetermined shape drawn in three dimensions. Further, the pixels values of all of the pixels P within the wafer W are similarly expressed in the height direction on the wafer W, whereby the distribution of the pixel values within the wafer W can be grasped as a circular wavefront in three dimensions. Grasping the distribution as the circular wavefront in three dimensions makes it possible to apply the Zernike polynomial, and to decompose the planar distribution Z of the pixel values within the wafer, for example, into a plurality of pixel value distribution components Zi such as gradient components in the right, left, top and bottom directions within the wafer, curvature components curved in a projecting shape or a recessed shape and so on through the use of the Zernike polynomial. The magnitude of each of the pixel value distribution components Zi can be expressed by the Zernike coefficient.

The Zernike coefficient representing each of the pixel value distribution components Zi can be concretely expressed by using polar coordinate arguments (r, θ) and a couple of degrees (n, m). The Zernike coefficients of a first term to a ninth term are listed below as examples.

Z1, n=0, m=0 (1)
Z2, n=1, m=1 (r·cos θ)
Z3, n=0, m=−1 (r·sin θ)
Z4, n=2, m=0 (2r²−1)
Z5, n=2, m=2 (r²·cos 2θ)
Z6, n=2, m=−2 (r²·sin 2θ)
Z7, n=3, m=1 ((3r³−2r)·cos θ)
Z8, n=3, m=−1 ((3r³−2r)·sin θ)
Z9, n=4, m=0 (6r⁴−6r²+1)
and so on.

In this embodiment, for example, the Zernike coefficient Z1 being the Zernike coefficient of the first term means the average value of the pixel values within the wafer, the second Zernike coefficient Z2 means the gradient component in the right and left directions of the pixel values within the wafer, the third Zernike coefficient Z3 means the gradient component in the forward and backward directions (a direction perpendicular to the direction of the gradient of the second Zernike coefficient Z2) of the pixel values within the wafer, and the fourth Zernike coefficient Z4 means the curvature component of the pixel values with the center of the wafer as the origin in this embodiment.

The Zernike coefficient calculation part 161 calculates the values of the pixel value distribution components Zi found by the component decomposition part 160. More specifically, the magnitude of each pixel value distribution component Zi is expressed by the Zernike coefficient as described above, and therefore the values of the Zernike coefficients are found to calculate the values of the pixel value distribution components Zi as illustrated in FIG. 10. Note that FIG. 10 exemplifies a case where the Zernike coefficients Z1 to Z5 of the first term to the fifth term are found for eight wafers W.

The Zernike coefficient group creation part 162 once records the values of the Zernike coefficients calculated by the Zernike coefficient calculation part 161 and then extracts the Zernike coefficients having the same couple of degrees, namely, the Zernike coefficients of the same term number, from the Zernike coefficients of a plurality of substrate images, thereby grouping the Zernike coefficients for each primary color, for example, as illustrated in FIG. 11. The Zernike coefficients are grouped such that, for example, the value "199.072" of the Zernike coefficient Z1 in the primary color R of the wafer No. 1 to the value "189.1831" of the Zernike coefficient Z1 in the primary color R of the wafer No. 8 are included in a group about the primary color R of the Zernike coefficient Z1 as illustrated in FIG. 11.

Figure 12:
FIG. 12 is a graph in which the standard deviation of the value of each Zernike coefficient for each primary color.

Next, the standard deviation calculation part 163 finds the standard deviation for each group of the primary colors and for each value of the Zernike coefficients having the same term number, for example, as illustrated in FIG. 12. FIG. 12 is a graph made by finding the standard deviation of each Zernike coefficient for each primary color and for each term number and expressing the term number of the Zernike coefficient on the horizontal axis and the standard deviation on the vertical axis for each of the primary colors R, G, B.

The primary color specification part 164 specifies a primary color having the highest standard deviation for each of the terms of the Zernike coefficients. For example, in the case of the standard deviation for each of the Zernike coefficients of each of the primary colors R, G, B illustrated in FIG. 12, the standard deviation of the primary color G is higher than those of the other two primary colors R, B in comparison among the primary colors R, G, B, for example, in the Zernike coefficient Z1, so that the primary color is specified as the primary color having the highest standard deviation for the Zernike coefficient Z1. Then, the specification of the primary color is performed, for example, on the Zernike coefficients of the first term to the fourth term. In the example illustrated in FIG. 12, since the standard deviation of the primary color G is higher than the standard deviation of any other color in Z2 to Z4, the primary color G is specified as the primary color having the highest standard deviation also in Z2 to Z4.

The reason why the specification of the primary color is performed here for the first term to the fourth term is that it has been confirmed by the verification carried out by the present inventors that the Zernike coefficients of the fifth and subsequent terms, if extracted, are less likely to influence the later-described synthesis of the reference image in the image creation part 167. This is probably because the gradients in the right, left, top and bottom directions of the planar distribution of the pixel values within the wafer W and the curvature components curved in a projecting shape or a recessed shape within the wafer W are covered by the Zernike coefficients of the first term to the fourth term so that a general tendency of the distribution of the pixel values within the wafer W can be grasped. However, for which term the value is extracted can be arbitrarily set and not limited to the content of this embodiment.

Next, the Zernike coefficient extraction part 165 extracts, for each group, the median value, the maximum value and the minimum value in the group from the grouped Zernike coefficients. Further, the extraction of the values is performed only on the above-described primary color specified by the primary color specification part 164. Taking, as an example, a case of the Zernike coefficient being the first term (Z1) among the Zernike coefficients illustrated in FIG. 11, "186.5951" being the value of the wafer No. "6" as the median value, "191.4602" being the value of the wafer No. "3" as the maximum value, and "172.689" being the value of the wafer No. "2" as the minimum value are extracted from the Zernike coefficients in the group of the primary color G. The Zernike coefficient extraction part 165 performs such extraction of values, for example, on the Zernike coefficients Z1 to Z4 of the first term to the fourth term for which the primary color is specified by the primary color specification part 164.

The extraction of the values of Zernike coefficients by the Zernike coefficient extraction part 165 is performed on the primary color specified by the primary color specification part 164 because of the following reason. It has been confirmed in the verification by the present inventors that, for example, when the pixel value of the primary color R in a substrate image is relatively higher than the pixel value of the primary color R in another substrate image, the pixel values of the other primary colors C, B are likely to be similarly relatively higher than the pixel values of the primary colors G, B in the another substrate image. Accordingly, the present inventors have considered that by extracting the values by the Zernike coefficient extraction part 165 for the primary color having the highest standard deviation, namely, the primary color having the largest relative variation in pixel value among the substrate images, the variation in pixel value among the substrate images can be most accurately extracted and the variation tendency is reflected in the values specified by the Zernike coefficient extraction part 165 also for the other primary colors. Therefore, the values of Zernike coefficients are to be extracted only for the primary color having the most highest standard deviation in this embodiment.

Figure 13:
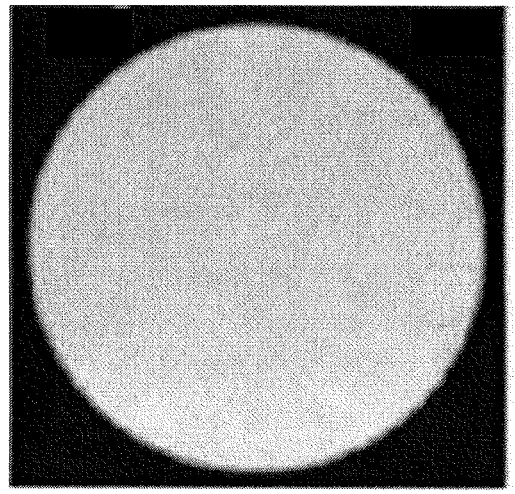
FIG. 13 is an explanatory view illustrating a substrate image of a wafer having the median value of the Zernike coefficient.
Figure 14:
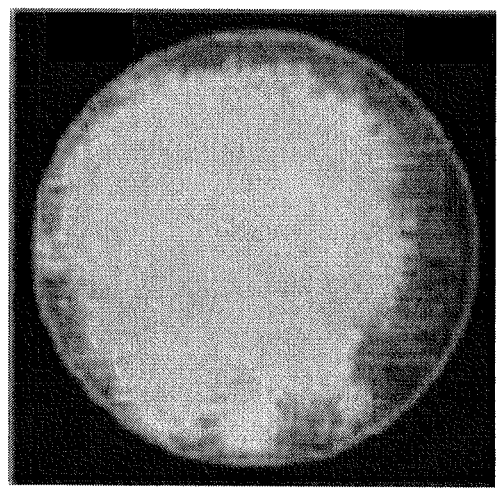
FIG. 14 is an explanatory view illustrating a substrate image of a wafer having the maximum value of the Zernike coefficient.
Figure 15:
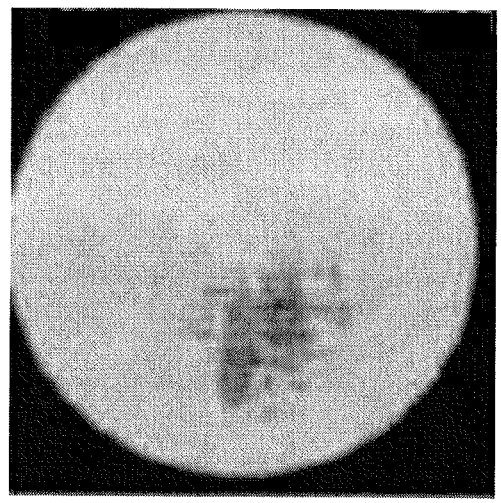
FIG. 15 is an explanatory view illustrating a substrate image of a wafer having the minimum value of the Zernike coefficient.

The image specification part 166 specifies the substrate images having the median value, the maximum value, and the minimum value extracted by the Zernike coefficient extraction part 165. For example, in the case of the primary color G and the Zernike coefficient Z4, the substrate image of the wafer No, "1" is specified as the substrate image having the median value "−0.27127," the substrate image of the wafer No. "2" is specified as the substrate image having the maximum value "0.215365," the substrate image of the wafer No. "6" is specified as the substrate image having the minimum value "−0.50281." In this case, in the substrate image having the median value in the group of the Zernike coefficient Z4, the pixel values within the wafer W are even without substantially no unevenness as illustrated in FIG. 13. Further, the substrate images having the maximum value and the minimum value in the group of the Zernike coefficient Z4 have unevenness near the outer peripheral portion and near the central portion of the wafers W respectively, for example, as illustrated in FIG. 14 and FIG. 15, in which the pixel values are greatly different between near the outer peripheral portion and near the central portion.

The image creation part 167 creates a substrate being a defect inspection reference image (reference image) by combining the substrate images specified by the image specification part 166. More specifically, a total of 12 substrate images having the median value, the maximum value, the minimum value of each of the Zernike coefficients Z1 to Z4 of the first term to the fourth term, specified by the image specification part 166 are combined together to create one reference image. The reference image created as described above includes the above-described color unevenness element and therefore has a function of filtering with respect to the color unevenness.

The substrate treatment system 1 according to this embodiment is configured as described above, and creation of the reference image and treatments of the wafer W performed in the substrate treatment system 1 configured as described above will be described next.

In the treatments on the wafer W, the cassette C housing a plurality of wafers W therein is first mounted on a predetermined mounting plate 13 in the cassette transfer-in/out section 10. Then, the wafers W in the cassette C are sequentially taken out by the wafer transfer apparatus 21 and transferred, for example, to the delivery unit 53 in the third block G3 in the treatment station 3.

Then, the wafer W is transferred by the wafer transfer apparatus 70 to the thermal treatment unit 40 in the second block G2 and temperature-regulated. Thereafter, the wafer W is transferred by the wafer transfer apparatus 70, for example, to the lower anti-reflection film forming unit 31 in the first block G1, in which a lower anti-reflection film is formed on the wafer W. The wafer W is then transferred to the thermal treatment unit 40 in the second block G2 and subjected to heat treatment. The wafer W is then returned back to the delivery unit 53 in the third block G3.

Then, the wafer W is transferred by the wafer transfer apparatus 90 to the delivery unit 54 in the same third block G3. Thereafter, the wafer W is transferred by the wafer transfer apparatus 70 to the adhesion unit 41 in the second block G2 and subjected to a hydrophobic treatment. The wafer W is then transferred by the wafer transfer apparatus 70 to the resist coating unit 32, in which a resist film is formed on the wafer W. The wafer W is then transferred by the wafer transfer apparatus 70 to the thermal treatment unit 40 and subjected to pre-baking. The wafer W is then transferred by the wafer transfer apparatus 70 to the delivery unit 55 in the third block G3.

Then, the wafer W is transferred by the wafer transfer apparatus 70 to the upper anti-reflection film forming unit 33, in which an upper anti-reflection film is formed on the wafer W. The wafer W is then transferred by the wafer transfer apparatus 70 to the thermal treatment unit 40, and heated and temperature-regulated. The wafer W is then transferred to the edge exposure unit 42 and subjected to edge exposure processing.

The wafer W is then transferred by the wafer transfer apparatus 70 to the delivery unit 56 in the third block G3.

The wafer W is then transferred by the wafer transfer apparatus 90 to the delivery unit 52 and transferred by the shuttle transfer apparatus 80 to the delivery unit 62 in the fourth block G4. The wafer W is then transferred by the wafer transfer apparatus 100 in the interface station 5 to the exposure apparatus 4 and subjected to exposure processing. The wafer W is then transferred by the wafer transfer apparatus 100 to the delivery unit 60 in the fourth block G4. The wafer W is then transferred by the wafer transfer apparatus 70 to the thermal treatment unit 40 and subjected to post-exposure baking. The wafer W is then transferred by the wafer transfer apparatus 70 to the developing treatment unit 30 and developed. After the development is finished, the wafer W is transferred by the wafer transfer apparatus 90 to the thermal treatment unit 40 and subjected to post-baking treatment.

Thereafter, the wafer W is transferred by the wafer transfer apparatus 70 to the delivery unit 62 in the fourth block G4. Then, the wafer W is transferred by the wafer transfer apparatus 100 to the defect inspection unit 63 and subjected to inspection of the wafer W. Data on the substrate image picked up by the image pickup apparatus 130 in the defect inspection unit 63 is inputted into the control unit 6 and into the reference image creation apparatus 150 via the control unit 6. Thereafter, the wafer W is transferred by the wafer transfer apparatus 70 to the delivery unit 50 in the third block G3, and then transferred by the wafer transfer apparatus 21 in the cassette station 2 to the cassette C on the predetermined mounting plate 13. Thus, a series of photolithography processing ends.

Further, the series of photolithography processing is repeatedly performed on the other wafers W in the same lot housed in the cassette C. Then, when a predetermined number of wafers W are picked up in the defect inspection unit 63, the substrate image of each wafer W is decomposed into a plurality of pixel value distribution components Zi by the component decomposition part 160 in the reference image creation apparatus 150. Then, the magnitude of each of the value distribution components Zi is calculated as the value of the Zernike coefficient by the Zernike coefficient calculation part 161.

Thereafter, the standard deviations are calculated by the standard deviation calculation part 163 for the values of the Zernike coefficients grouped by the Zernike coefficient group creation part 162. Subsequently, a primary color having the highest standard deviation is specified by the primary color specification part 164 on the basis of the calculated standard deviations of the Zernike coefficients, and predetermined values are extracted about the Zernike coefficients relating to the specified primary color by the Zernike coefficient extraction part 165. Then, the substrate images having the values extracted by the Zernike coefficient extraction part 165 are specified by the image specification part 166, and the specified substrate images are combined together to create a reference image by the image creation part 167.

Further, the control unit 6 compares the reference image with the substrate image of each wafer W picked up in the defect inspection unit 63, and determines that there is no defect when the difference between the pixel value in each pixel of the substrate image and the pixel value in each pixel of the reference image falls within a predetermined value. On the other hand, it is determined that there is a defect when pixels having a difference in pixel value of the predetermined value or more exist in a predetermined range or more. Then, the substrate image determined as having a defect is compared with the defect models, whereby its concrete defect is specified. In this event, the reference image is made to include predetermined color unevenness by the reference image creation apparatus 150, so that occurrence of a false defect caused by the color unevenness can be avoided in this defect inspection.

Then, the defect inspection is performed also on the other wafers W in the same lot, with which a series of defect inspection ends.

According to the above embodiment, the component decomposition part 160 of the reference image creation apparatus 150 decomposes the planar distribution Z of pixel values in the substrate image into a plurality of pixel value distribution components $Z_i$ through the use of the Zernike polynomial, and the plurality of pixel value distribution components $Z_i$ are calculated as values of Zernike coefficients respectively. Then, from among the calculated values of the Zernike coefficients, the median value, the maximum value and the minimum value are extracted for every Zernike coefficients having the same couple of degrees, and substrate images having the extracted values are specified. Then, by combining the specified substrate images together, an appropriate reference image of the wafer W having a function of filtering with respect to the color unevenness can be created. Consequently, it is possible to avoid occurrence of a false defect and appropriately perform defect inspection of the wafer W. Further, the creation of an appropriate reference image having a filtering function can also prevent a wafer W originally having a defect from being determined as having no defect. Furthermore, the appropriate reference image can be created regardless of, for example, the level of skill of the operator, so that the defect inspection of a substrate can be stably performed.

Further, defect information included in the defect determination models for performing concrete defect determination, namely, wind ripple, comet, scratch do not so greatly change in content irrespective of the processing recipe, whereas the occurrence state of color unevenness causing a false defect greatly affected by the processing recipe for the wafer W. For this reason, it has been conventionally necessary to create the reference image beforehand for each recipe in order to avoid the false defect, and a large amount of labor has been spent. Regarding this point, the creation of the reference image in the reference image creation apparatus 150 as described above in parallel with the series of photography processing on the wafer W being a product eliminates the need to create the reference image beforehand for inspection of the wafer W in the defect inspection unit 63. This eliminates the need for preliminary creation of the reference image which has been conventionally performed, resulting in great reduction in labor to be spent on the defect inspection of the wafer W.

Note that though the Zernike coefficient group creation part 162 is provided in the reference image creation apparatus 150 in the above embodiment, the Zernike coefficient group creation part 162 does not always need to be provided, and predetermined Zernike coefficients may be directly extracted via the standard deviation calculation part 163, the primary color specification part 164, and the Zernike coefficient extraction part 165 from the Zernike coefficients as illustrated in FIG. 10 found, for example, by the Zernike coefficient calculation part 161.

Further, when the pixel value of a predetermined primary color in a substrate image is relatively higher than the pixel value of the primary color in another substrate image, the pixel values of the other primary colors G, B are likely to be similarly relatively higher than the pixel values of the primary colors G, B in the another substrate image. Accordingly, the standard deviation calculation part 163 and the primary color specification part 164 do not always need to be provided, and, for example, the extraction of the values of the Zernike coefficients by the Zernike coefficient extraction part 165 may be performed only on one predetermined arbitrary primary color. Note that the present invention is, of course, applicable to the case where the substrate image is monochrome, in which case the processing in the standard deviation calculation part 163 and the primary color specification part 164 is unnecessary. Further, when the substrate image is monochrome or when the extraction of the values of the Zernike coefficients is performed by the Zernike coefficient extraction part 165 only for the one arbitrary primary color, it is only necessary to perform grouping in the Zernike coefficient group creation part 162 only for every Zernike coefficients having the same couple of degrees.

Though the median value, the maximum value and the minimum value of the Zernike coefficients are extracted for every Zernike coefficients having the same couple of degrees by the Zernike coefficient extraction part 165 in the above embodiment, the values extracted by the Zernike coefficient extraction part 165 are not limited to the content of the above embodiment. More specifically, the substrate image having color unevenness desired to be an object of filtering in order to avoid the false defect can be translated into a substrate image having a value of the Zernike coefficient deviated from the median value of the Zernike coefficient by a predetermined value or more. Accordingly, determining for what degree of color unevenness the filtering is performed is equivalent to deciding how much the values of substrate images to be used for the synthesis of the reference image are deviated from the median value of the Zernike coefficient. In this case, for example, the values of the Zernike coefficients deviated by the predetermined value may be set, in place of the already-described maximum value and minimum value, to values in ranges of the top 5% and the bottom 5% of the Zernike coefficients grouped by the Zernike coefficient group creation part 162. As a matter of course, the ranges of the top and the bottom can be arbitrarily set.

Note that, as for the values in the ranges of the top 5% and the bottom 5%, for example, when 40 Zernike coefficient values exist in a group of the same term of the Zernike coefficients, two values in descending order of value correspond to the values in the range of the top 5% and two values in ascending order of value correspond to the values in the range of the bottom 5%. In this event, both or any one of the two values may be used for specifying the image by the image specification part 166.

Further, there may be a case where the distribution of the Zernike coefficients is greatly different from the normal distribution in which the median value of the Zernike coefficient is biased to the maximum value side or the minimum value side. In this case, a value simply deviated by a predetermined value or more from the median value may be extracted. This makes it possible, when the minimum value of the Zernike coefficient is close to the median value, to prevent the substrate image having the minimum value of the Zernike coefficient from being used for the synthesis of the reference image. The reference image is made such that the features of the substrate images, namely, color unevenness and the like are made more even and the effect of the filtering is lowered further as the number of substrate images used for the synthesis is larger. Therefore, a smaller number of the substrate images to be used for the synthesis of the reference image is more preferable. Accordingly, the value deviated from the median value by the predetermined value or more is appropriately set to minimize the number of values extracted by the Zernike coefficient extraction part 165, thereby creating a more appropriate reference image.

Note that for creation of the reference image, it is preferable to compare each of the substrate images picked up by the image pickup apparatus 130 in the defect inspection unit 63 with the defect models first in the control unit 6 before input of the substrate images into the reference image creation apparatus 150, and to input only the substrate images determined as having no defect as a result of the comparison with the defect models into the reference image creation apparatus 150. This configuration makes it possible to avoid the substrate image having an actual defect not a false defect from being inputted into the reference image creation apparatus 150 and a reference image having a filtering function with respect to the actual defect from being created.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. The present invention is not limited to this embodiment but can take various forms. Though the image pick-up object is the front surface of the substrate in the above embodiment, the present invention is also applicable to the case of picking up an image of the rear surface of the substrate. Further, though the above-described embodiment is the example in the coating and developing treatment system for the semiconductor wafer, the present invention is also applicable to the case of a coating and developing treatment system for another substrate such as an FPD (Flat Panel Display), a mask reticle for a photomask or the like other than the semiconductor wafer.

The present invention is useful in creating a reference image for appropriately performing defect inspection of a substrate.

What is claimed is:

1. A method of picking up images of substrates and creating a substrate image being a defect inspection reference on a basis of a plurality of the picked-up substrate images, comprising:
   a component decomposition step of decomposing a planar distribution of pixel values in the picked-up substrate image into a plurality of pixel value distribution components through use of a Zernike polynomial for each of the substrate images;
   a Zernike coefficient calculation step of calculating Zernike coefficients of the pixel value distribution components decomposed through use of the Zernike polynomial;
   a Zernike coefficient extraction step of extracting, for every Zernike coefficients having a same couple of degrees, from the calculated Zernike coefficients,
   (1) a median value, and
   (2) values deviated from the median value by a predetermined value or more;
   an image specification step of specifying substrate images having the extracted values; and
   an image creation step of creating a substrate image being a defect inspection reference by combining the specified substrate images.

2. The substrate reference image creation method according to claim 1,
   wherein in the Zernike coefficient extraction step, the calculated Zernike coefficients are grouped for every Zernike coefficients having the same couple of degrees, and the values are extracted from each group of the Zernike coefficients.

3. The substrate reference image creation method according to claim 2,
   wherein when the substrate image is composed of a plurality of primary colors, the calculation and grouping of the Zernike coefficients are further performed for each of the primary colors constituting the substrate image,
   wherein a standard deviation of the calculated Zernike coefficient is found for each group of the primary colors,
   wherein a primary color having a highest standard deviation is specified for each couple of degrees of the Zernike coefficient, and
   wherein the extraction of values in the Zernike coefficient extraction step is performed from values belonging to the group of the primary color specified to have the highest standard deviation.

4. The substrate reference image creation method according to claim 2,
   wherein in the Zernike coefficient extraction step, the values are extracted from groups relating to Zernike coefficients of a first term to a fourth term.

5. The substrate reference image creation method according to claim 2,
   wherein the values of the Zernike coefficients deviated from the median value of the Zernike coefficient by a predetermined value are a maximum value and a minimum value of the grouped Zernike coefficients.

6. The substrate reference image creation method according to claim 2,
   wherein the values of the Zernike coefficients deviated from the median value of the Zernike coefficient by a predetermined value are values in ranges of a top 5% and a bottom 5% of the grouped Zernike coefficients.

7. A non-transitory computer readable storage medium storing a program running on a computer of a control unit that controls a substrate treatment system to cause the substrate treatment system to execute a method of creating a substrate reference image being a defect inspection reference on a basis of a plurality of picked-up substrate images,
   the reference image creation method comprising:
   a component decomposition step of decomposing a planar distribution of pixel values in the picked-up substrate image into a plurality of pixel value distribution components through use of a Zernike polynomial for each of the substrate images;
   a Zernike coefficient calculation step of calculating Zernike coefficients of the pixel value distribution components decomposed through use of the Zernike polynomial;
   a Zernike coefficient extraction step of extracting, for every Zernike coefficients having a same couple of degrees, from the calculated Zernike coefficients,
   (1) a median value, and
   (2) values deviated from the median value by a predetermined value or more;
   an image specification step of specifying substrate images having the extracted values; and
   an image creation step of creating a substrate image being a defect inspection reference by combining the specified substrate images.

8. A defect inspection method of inspecting a substrate for a defect through use of a reference image created by a method of creating a substrate reference image being a defect inspection reference on a basis of a plurality of picked-up substrate images, the reference image creation method comprising:
- a component decomposition step of decomposing a planar distribution of pixel values in the picked-up substrate image into a plurality of pixel value distribution components through use of a Zernike polynomial for each of the substrate images;
- a Zernike coefficient calculation step of calculating Zernike coefficients of the pixel value distribution components decomposed through use of the Zernike polynomial;
- a Zernike coefficient extraction step of extracting, for every Zernike coefficients having a same couple of degrees, from the calculated Zernike coefficients,
  (1) a median value, and
  (2) values deviated from the median value by a predetermined value or more;
- an image specification step of specifying substrate images having the extracted values; and
- an image creation step of creating a substrate image being a defect inspection reference by combining the specified substrate images, the defect inspection method comprising:
picking up an image of an inspection target substrate and comparing the picked-up inspection target substrate image and the reference image created in the image creation step to determine presence or absence of a defect.

9. A non-transitory computer readable storage medium storing a program running on a computer of a control unit that controls a substrate treatment system to cause the substrate treatment system to execute a defect inspection method of inspecting a substrate for a defect through use of a reference image created by a method of creating a substrate reference image being a defect inspection reference on a basis of a plurality of picked-up substrate images, the reference image creation method comprising:
- a component decomposition step of decomposing a planar distribution of pixel values in the picked-up substrate image into a plurality of pixel value distribution components through use of a Zernike polynomial for each of the substrate images;
- a Zernike coefficient calculation step of calculating Zernike coefficients of the pixel value distribution components decomposed through use of the Zernike polynomial;
- a Zernike coefficient extraction step of extracting, for every Zernike coefficients having a same couple of degrees, from the calculated Zernike coefficients,
  (1) a median value, and
  (2) values deviated from the median value by a predetermined value or more;
- an image specification step of specifying substrate images having the extracted values; and
- an image creation step of creating a substrate image being a defect inspection reference by combining the specified substrate images, and the defect inspection method comprising:
picking up an image of an inspection target substrate and comparing the picked-up inspection target substrate image and the reference image created in the image creation step to determine presence or absence of a defect.

10. An apparatus for creating a substrate image being a defect inspection reference on a basis of a plurality of substrate images picked up by an image pickup apparatus, comprising:
- a component decomposition part configured to decompose a planar distribution of pixel values in the picked-up substrate image into a plurality of pixel value distribution components through use of a Zernike polynomial for each of the substrate images;
- a Zernike coefficient calculation part configured to calculate Zernike coefficients of the pixel value distribution components decomposed through use of the Zernike polynomial;
- a Zernike coefficient extraction part configured to extract, for every Zernike coefficients having a same couple of degrees, from the calculated Zernike coefficients,
  (1) a median value, and
  (2) values deviated from the median value by a predetermined value or more;
- an image specification part configured to specify substrate images having the extracted values; and
- an image creation part configured to create a substrate image being a defect inspection reference by combining the specified substrate images.

11. The substrate reference image creation apparatus according to claim 10,
wherein in the Zernike coefficient extraction part, the calculated Zernike coefficients are grouped for every Zernike coefficients having the same couple of degrees, and the values are extracted from each group of the Zernike coefficients.

12. The substrate reference image creation apparatus according to claim 11, further comprising:
- a Zernike coefficient group creation part configured to, when the substrate image is composed of a plurality of primary colors, perform the calculation and grouping of the Zernike coefficients further for each of the primary colors constituting the substrate image;
- a standard deviation calculation part configured to find a standard deviation of the calculated Zernike coefficient for each group of the primary colors; and
- a primary color specification part configured to specify a primary color having a highest standard deviation for each couple of degrees of the Zernike coefficient,
wherein the extraction of values in the Zernike coefficient extraction part is performed from values belonging to the group of the primary color specified to have the highest standard deviation.

13. The substrate reference image creation apparatus according to claim 11,
wherein in the Zernike coefficient extraction part, the values are extracted from groups relating to Zernike coefficients of a first term to a fourth term.

14. The substrate reference image creation apparatus according to claim 11,
wherein the values of the Zernike coefficients deviated from the median value of the Zernike coefficient by a predetermined value are a maximum value and a minimum value of the grouped Zernike coefficients.

15. The substrate reference image creation apparatus according to claim 11,
wherein the values of the Zernike coefficients deviated from the median value of the Zernike coefficient by a predetermined value are values in ranges of a top 5% and a bottom 5% of the grouped Zernike coefficients.

16. A defect inspection unit comprising a substrate reference image creation apparatus,
the reference image creation apparatus being an apparatus for creating a substrate image being a defect inspection reference on a basis of a plurality of picked-up substrate images and comprising:

a component decomposition part configured to decompose a planar distribution of pixel values in the picked-up substrate image into a plurality of pixel value distribution components through use of a Zernike polynomial for each of the substrate images;

a Zernike coefficient calculation part configured to calculate Zernike coefficients of the pixel value distribution components decomposed through use of the Zernike polynomial;

a Zernike coefficient extraction part configured to extract, for every Zernike coefficients having a same couple of degrees, from the calculated Zernike coefficients,
  (1) a median value, and
  (2) values deviated from the median value by a predetermined value or more;

an image specification part configured to specify substrate images having the extracted values; and an image creation part configured to create a substrate image being a defect inspection reference by combining the specified substrate images, the defect inspection unit comprising:

an image pickup apparatus configured to pick up an image of an inspection target substrate; and a defect determination part configured to compare the inspection target substrate image picked up by the image pickup apparatus and the reference image created in the image creation part to determine presence or absence of a defect.

\* \* \* \* \*